United States Patent [19]

Bauman et al.

[11] Patent Number: 5,024,623

[45] Date of Patent: Jun. 18, 1991

[54] ELECTRICAL CIRCUIT BOARD MOUNTING METHOD

[75] Inventors: Ralph E. Bauman, Lancaster; Horace W. Seymour, III, Landisville, both of Pa.

[73] Assignee: Sanders Associates, Inc., Nashua, N.H.

[21] Appl. No.: 544,860

[22] Filed: Jun. 27, 1990

Related U.S. Application Data

[60] Division of Ser. No. 391,681, Aug. 11, 1989, which is a continuation of Ser. No. 16,145, Feb. 18, 1987, abandoned.

[51] Int. Cl.⁵ ............................................. H01R 4/02
[52] U.S. Cl. .................................... 439/876; 361/401; 435/84
[58] Field of Search ..................... 439/82, 83, 876; 174/52.5; 361/401, 404

[56] References Cited

U.S. PATENT DOCUMENTS

| | | | |
|---|---|---|---|
| 3,337,82 | 8/1967 | Englebrecht | 333/73 |
| 2,512,426 | 6/1950 | Hartley | 113/112 |
| 2,915,716 | 10/1956 | Hattersley | 333/73 |
| 2,922,968 | 1/1960 | Patten | 333/73 |
| 2,995,617 | 8/1961 | Maximoff et al. | 174/153 |
| 3,150,336 | 9/1964 | Gonda | 333/33 |
| 3,264,524 | 8/1966 | Danlgren et al. | 317/101 |
| 3,383,648 | 5/1968 | Tems | 339/258 |
| 3,500,428 | 3/1970 | Awen | 361/401 X |
| 3,660,725 | 5/1972 | Ammon et al. | 317/101 |
| 3,864,014 | 2/1975 | Lynch | 339/275 |
| 4,015,328 | 4/1977 | McDonough | 29/625 |
| 4,017,142 | 4/1977 | Clark et al. | 339/220 |
| 4,072,377 | 2/1978 | Van de Loo et al. | 339/17 |
| 4,100,589 | 7/1978 | McGann | 361/401 X |
| 4,357,647 | 11/1982 | Hadersbeck et al. | 439/876 X |
| 4,577,923 | 3/1986 | Ikemizu | 439/876 |
| 4,631,639 | 12/1986 | Biraud | 361/417 |
| 4,661,887 | 4/1987 | Lin | 361/405 |
| 4,795,353 | 1/1989 | Baker | 439/82 X |

FOREIGN PATENT DOCUMENTS 2334534 7/1972 Fed. Rep. of Germany ...... 325/339

Primary Examiner—Eugene F. Desmond
Attorney, Agent, or Firm—Cesari & McKenna

[57] ABSTRACT

A circuit board is aligned with the housing so that a mounting pin may be inserted through a circuit board mounting hole into a housing mounting bore. The pin is heated when inserted into the bore so that solder at the bottom tip is in a melted state. After the pin is in the bore, the solder fuses and secures the pin in the bore. Accordingly, the pin head secures the electrical circuit board to the housing.

4 Claims, 4 Drawing Sheets

ELECTRICAL CIRCUIT BOARD MOUNTING METHOD

This application is a divisional of U.S. Pat. application Ser. No. 07/391,681, filed on Aug. 11, 1989, which was a File Wrapper Continuation of U.S. Pt. application Ser. No. 07/016,145, filed on Feb. 18, 1987, now abandoned.

FIELD OF THE INVENTION

This invention relates to an apparatus for mounting an electrical circuit board to a housing, and more particularly to a solder secured mounting pin for mounting a microstrip carrier board to a housing.

BACKGROUND OF THE INVENTION

Almost all personal, commercial, industrial and military electronic devices have some type of electrical circuit board mounted to a housing. This is true for microstrip carrier boards, used to process microwave signals, that are housed in radio frequency processing boxes. Typically microstrip carrier boards, like other circuit boards, have been secured to the housing by screws that are fastened into threaded mounting bores in the housing.

Although screws have been used extensively to fasten circuit boards to housings, there are disadvantages associated with their use. It is relatively expensive to provide a housing with threaded mounting bores. When the circuit board is removed for repair or replacement, there is always the possibility that the bore threading will be stripped, making it impossible to refasten the circuit board to the housing. The possibility that this will happen increases if circuit boards are repetitively inserted and removed from the housing and the threading becomes worn. Furthermore, screw fastening is a labor intensive operation and dependent upon the skill of the operator.

There are also a number of reasons why screw fastening is an especially disadvantageous way to attach microstrip carriers to radio frequency processing boxes. Microstrip carriers tend to be miniaturized, and the boxes in which they are housed have a relatively thin profile. Since the mounting bores are small, the relative cost of tapping them so they are threaded is high. Furthermore, some boxes are too thin to allow for threaded bores of sufficient depth to accommodate screws that can securely fasten carrier boards.

Also, microstrip carriers are attached to connecting circuitry located in the radio frequency processing box. Usually, this connection is made by a solder bridge that should be as short as possible to minimize the impedance of the connection. The box mounting bores and carrier screw holes must be closely aligned to ensure that the carrier is secured in the box and the gap between the carrier and the connecting circuitry is as small as possible. This further increases the cost of the fastening connection since the location of the box bores and circuitry screw holes must be precisely machined.

Furthermore, tolerances between the screws and bores increase as the bore threading becomes worn with repeated carrier insertion and removal. This may make it difficult to securely fasten the carrier to the housing so as to maintain the solder bridge between the carrier and the connection circuitry.

A need therefore exists for an improved method for mounting a circuit board, such as a microstrip carrier, to a housing. The method should not rely on closely aligned bores and screw holes, should be compatible with relatively thin housings, and not be labor intensive or operator dependent. The new method of mounting should also allow for repetitive insertion and removal of the circuit board without impairing the integrity of the mount, and it should allow for the repetitive precise mounting of a circuit board to the housing. Furthermore, the new method of mounting should not require relatively expensive mounting fixtures for either the housing or circuit board.

SUMMARY OF THE INVENTION

This invention comprises a mounting pin that is inserted through a hole in circuit board into a mounting bore in the housing structure. The mounting pin, formed of copper, brass, or other appropriate metal, has an application of solder at its lower end.

The mounting pin is inserted through the circuit board hole into the mounting bore by a heated insertion tool. The insertion tool heats the pin so that when the pin is inserted into the mounting bore, the solder is melted. After the pin is positioned in the bore, the insertion tool is removed The solder then solidifies, securing the pin in the bore The pin head, or a leaf washer, fastens the circuit board to the housing.

To remove the circuit board, all that is necessary is to heat the pin with the insertion tool until the solder melts, and remove the pin. To refasten the circuit board, the pin is reinserted as it was originally inserted.

This method of mounting circuit boards eliminates the need for threaded bores and expensive screws. Since the bores are not threaded, the pins can be inserted and removed a number of times without incurring the problems caused by thread wear.

The solder connection between the pin and the bore permits the pin to be fastened in bores of minimal depth. Thus, this mounting method facilitates the mounting of circuit boards to relatively thin housings.

Since the solder connection does not form until the pin is set and the solder solidifies the width of the bore hole, the bore hole can be relatively large to allow for exact positioning of the circuit board in the housing. This means a microstrip carrier can first be positioned in a radio frequency processing box so that the gap between the carrier and the box's connecting circuitry is as small as possible. The carrier can then be secured to the box by inserting a mounting pin.

DETAILED DESCRIPTION OF THE PREFERRED EMBODIMENTS

Figure 1:
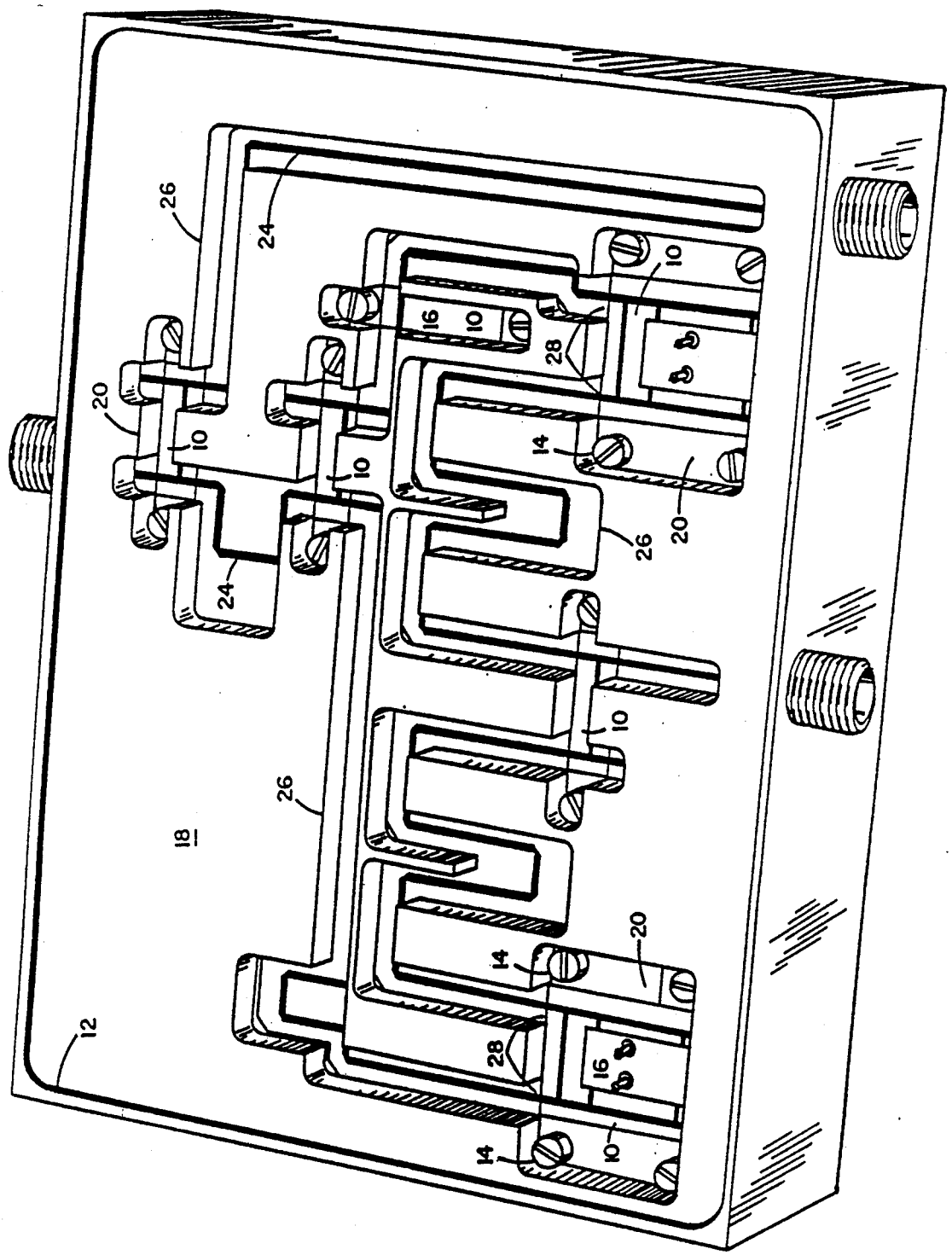
FIG. 1 is a top view of microwave carrier circuits fastened in a radio frequency processing box by the apparatus of this invention.

As shown in FIG. 1, a number of microwave carrier circuits 10 are fastened into a radio frequency processing box 12 by mounting pins 14. On the top surface of each of the microwave carriers are microwave circuit elements 16. The processing box 12 has a solid interior body 18. Each of the microwave carriers 10 is located in a separate recessed cavity 20 in the body 18. The carriers 10 are connected to each other, and to external coaxial connectors 22, by processing box connecting circuitry 24 located in recessed grooves 26 in the box body 18. Solder bridges 28 connect the microwave carrier circuit elements 16 to the box conducting circuitry 24.

Figure 2A:
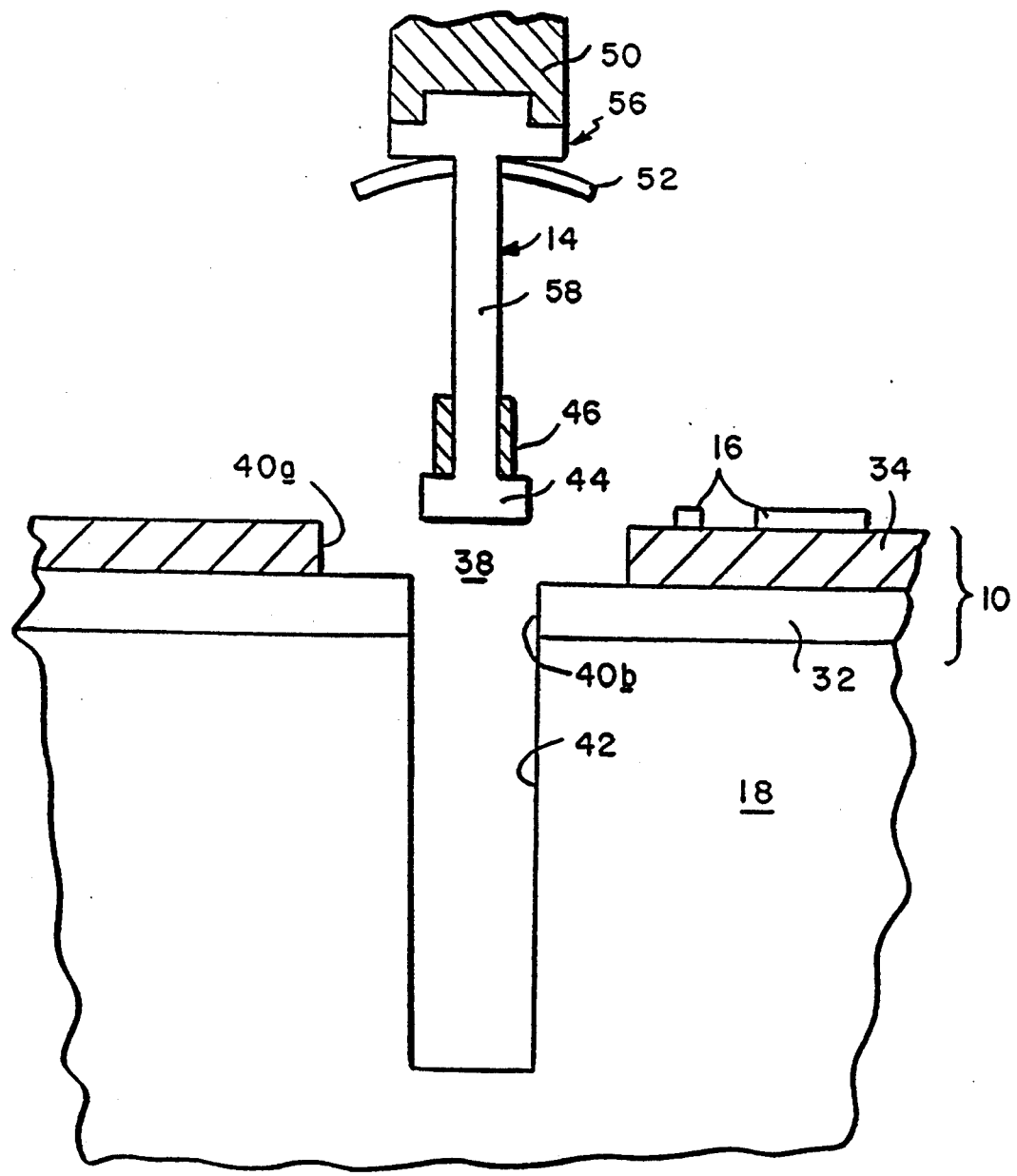
FIG. 2a is a cross-sectional view showing a mounting pin being originally inserted to fasten a microwave carrier to a housing.

As illustrated in FIG. 2a, the microwave carrier circuit 10 comprises a stamped carrier 32 underneath a dielectric medium 34. The microwave circuit elements 16 are printed on the top surface of the dielectric medium 34. The carrier circuit is provided with one or more mounting holes 38. In this embodiment of the invention the top mounting hole portion 40a, defined by the dielectric medium 34, is of a greater diameter than the lower mounting hole portion 40b, defined by the stamped carrier 32. The box body 18 is provided with a number of mounting bores 42 of the same diameter as the microwave carrier mounting hole lower portion 40b.

To fasten the microwave carrier 10 to the radio frequency processing box 12 according to this invention, the microwave carrier is first placed in the appropriate box cavity 20 so the carrier microwave mounting holes 38 are aligned over the box mounting bores 42. The microwave circuit elements 16 and box connecting circuitry 24 may then be connected by solder bridges, or other means, (not illustrated here.) A carrier mounting pin 14 (FIG. 2a) is then inserted through the microwave circuit mounting hole 38 (FIG. 2a) into the box mounting bore 42 (FIG. 2a). The mounting pin has a tip portion 44 that supports an application of solder 46.

Figure 2B:
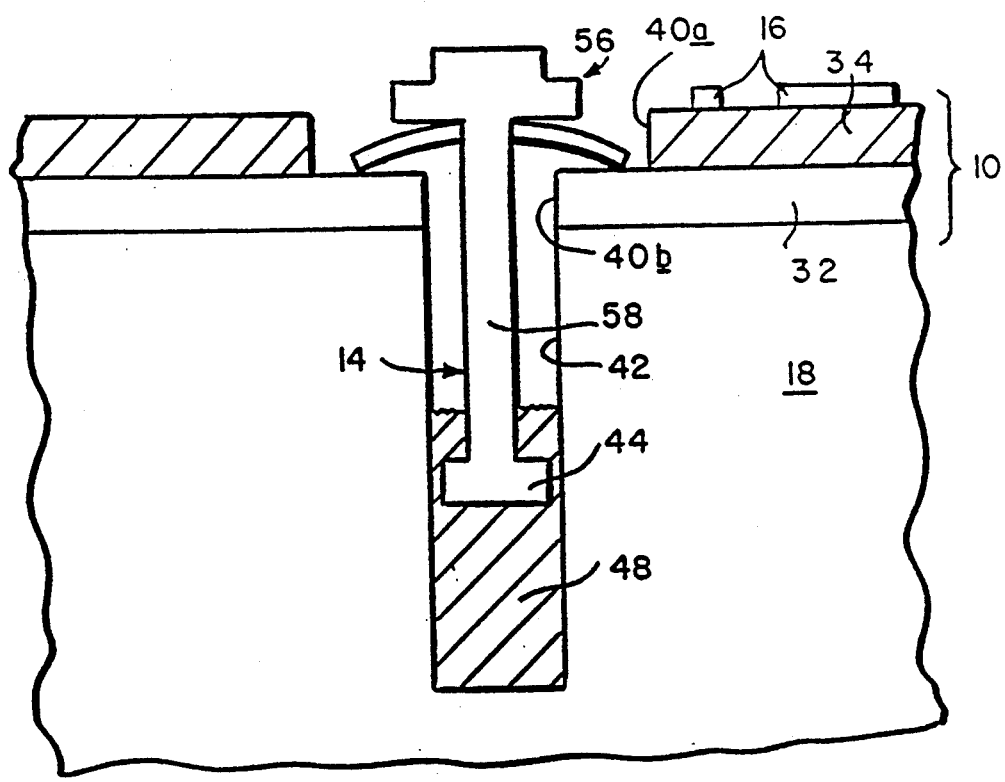
FIG. 2b is a cross-sectional view showing a mounting pin fastening a microwave carrier to a housing.

The mounting pin 14 is inserted into the mounting bore with an insertion tool 50 having a heated tip. The insertion tool 50 transmits sufficient heat to the mounting pin 14 to melt the solder 46. After the mounting pin 14 is inserted in the mounting bore 42, the insertion tool 50 is removed. The solder 46 solidifies inside the mounting bore 42 to secure the mounting pin 14 inside the bore, as FIG. 2b illustrates. A leaf washer 52 (FIG. 2a) located below the head 56 of the mounting pin 14 fastens the carrier 10 to the box body 18.

Figure 2C:
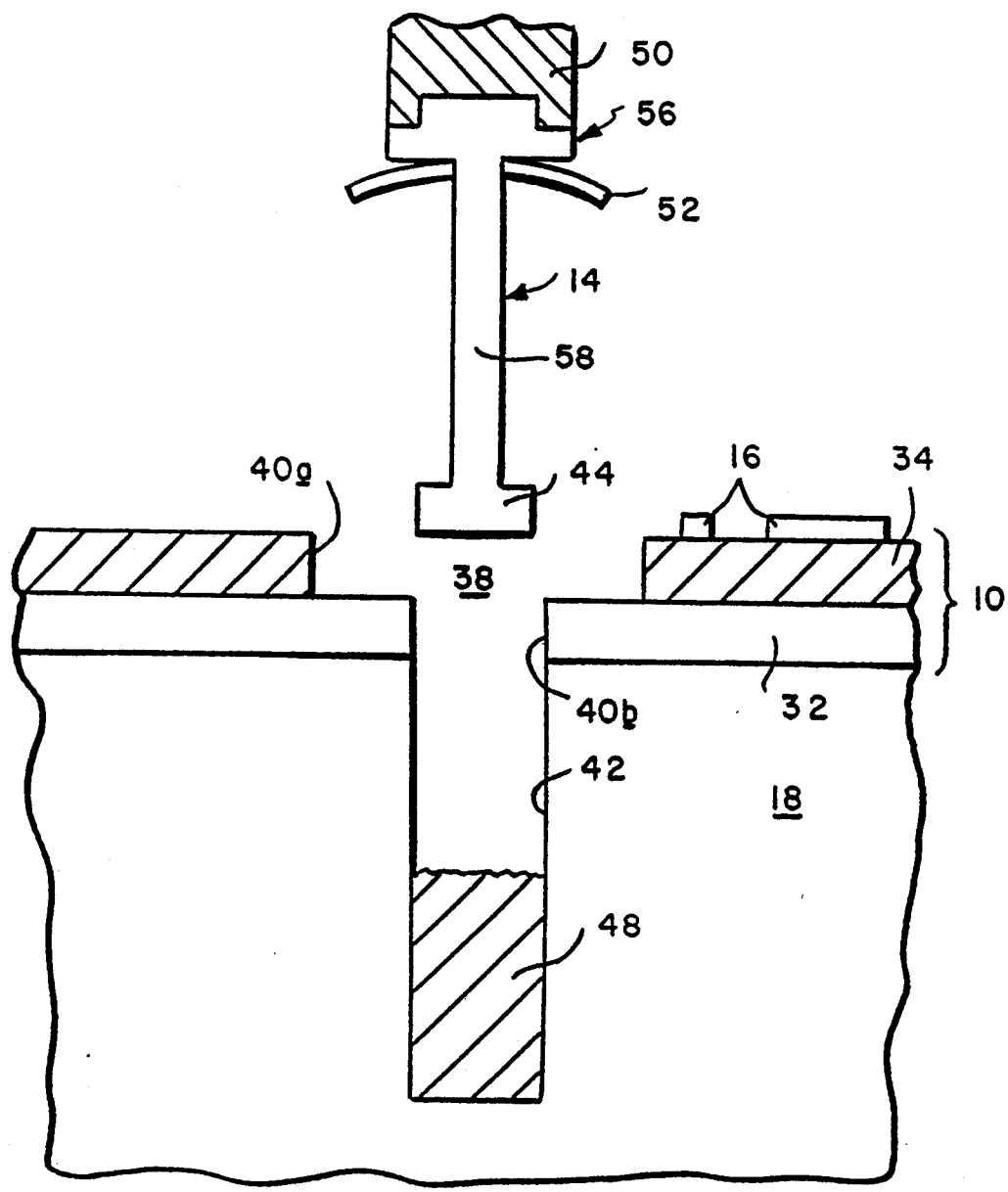
FIG. 2c is a cross-sectional view of a mounting pin being removed from a housing.

To detach a microwave carrier 10, the insertion tool 50 is used to melt the solder and remove the mounting pin 44, as FIG. 2c illustrates. This leaves a pool of solder 48 in the bottom of the mounting bore. The pool of fused solder 48 is available to re-secure the mounting pin 14 in the bore 42 when the microwave carrier 10 is reattached to the box body 12.

Figure 3:
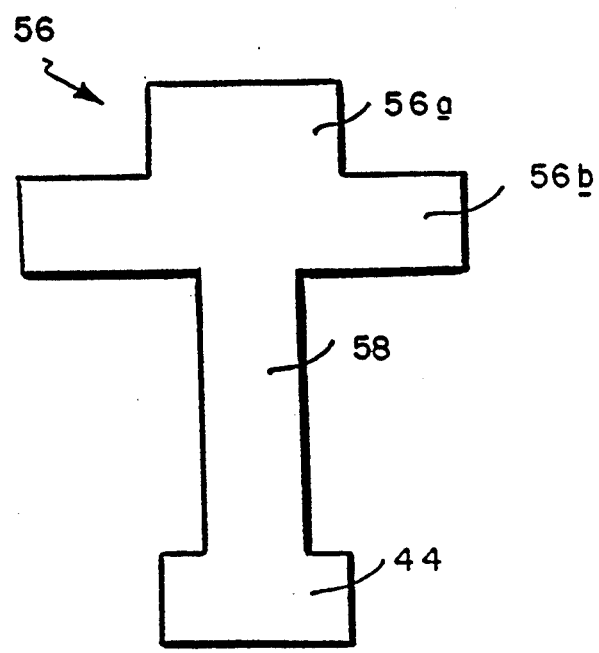
FIG. 3 is a side view of a mounting pin according to the preferred embodiment of this invention.

The mounting pin 14 of this invention is composed of copper, brass, or some other suitable material. It includes a pin head 56 and a tip 44 separated by a shaft 58, as FIG. 3 illustrates. The pin head 56 has a top section 56a that can be secured by the insertion tool 50. A pin head bottom section 56b, whose diameter is greater than that of the top section 56a, urges the leaf washer against the top surface of the carrier 10 to fasten it to the box body 12. The pin tip 44 has a larger diameter than the pin shaft 58 so that the upper surface of the pin tip 44 can support a supply of solder. The diameter of this pin tip 44 should be great enough to hold enough solder 46 but small enough to be inserted into the mounting bore 42. After the solder 48 has solidified inside the bore 42, the pin tip 44 serves as a base section to secure the pin 14 in the bore 42.

It is possible for this method of fastening to serve to electrically connect an electrical board to the housing. In this embodiment of the invention, the portion of the box body 18 defining the box may be part of the radio frequency processing box 12 ground plane, (not illustrated here.) The mounting pin 44, in contact with the stamped carrier 32, would also connect the stamped carrier to the box ground plane.

Also, one can use this mounting method to fasten other types of electrical circuits to other types of housings. A housing can be provided with a number of sleeve portions that support the circuit board and define the mounting bores (not illustrated here). In such an embodiment the mounting pin may pass through an insulated portion of the circuit board and be isolated from active electrical connections.

Use of this invention to mount microwave carriers eliminates the need to provide threaded bores in the radio frequency processing box. Inserting and fastening the pin is a simple operation and is only minimally operator dependent. Pins can be repeatedly secured in and removed from the box without the possibility that wear will render the microwave carrier, the pin, or the mounting bore useless for fastening. If necessary, additional solder can always be added to the pin before insertion.

Furthermore, since the pins can be fastened in bores of minimal depth, this system of fastening can be used with an electrical box having a relatively thin profile. In addition, the pin does not have to be in an exact position inside the bore to fasten the microwave carrier. This means there can be a relatively high tolerance between the microwave carrier and the mounting board so the carrier been placed in the best position in the box to obtain an optimal electrical connection.

While the embodiment of the invention described relates to fastening a microwave carrier to a radio frequency processing box, it will be understood that this description and illustrations are offered only as an example of the invention, whose scope is to be limited only by the claims.

What is claimed as new and desired to be secured by Letters Patent of the United States is:

1. An electrical circuit board assembly comprising:
   A. an electrical circuit board having a mounting hole extending therethrough;
   B. an electrical housing having a mounting bore therein; and
   C. a pin having a pin shaft extending through said mounting hole into said mounting bore and secured by solidified solder in said mounting bore, said pin having a pin head and a leaf washer, said pin head having a greater diameter than said pin shaft, said leaf washer disposed between said pin head and said electrical circuit board and engaging the surface of the electrical circuit board to secure said electrical circuit board to said electrical housing.

2. The assembly of claim 1 wherein said electrical circuit board further comprises:
   A. a microwave carrier circuit having a stamped carrier with a dielectric medium thereon, said dielectric medium having microwave circuitry printed thereon; and
   B. said mounting hole extending through said dielectric medium and said stamped carrier.

3. The assembly of claim 2 wherein:
   A. said electrical housing is a radio frequency processing box having a ground plane, and the portion of said box that defines said mounting bore is part of said ground plane; and B. the diameter of the portion of said mounting hole that extends through said dielectric medium is greater than the diameter of said pin securing means, which is in turn greater than the diameter of the portion of the mounting hole that extends through the stamped carrier, said pin securing means is in contact with said stamped carrier, and said pin and solder are in contact with said electrical housing ground through said portion of box that defines said mounting bore so as to form an electrical connection between said stamped carrier and said electrical housing ground.

4. The assembly of claim 1 wherein said pin further comprises a pin tip, said pin tip located at the end of said pin shaft and having a diameter greater than that of said pin shaft.

* * * * *